United States Patent
Bill

[11] Patent Number: 5,533,445
[45] Date of Patent: Jul. 9, 1996

[54] AUTOMATED PRINTING MACHINE AND PROCESS

[76] Inventor: Ralph J. Bill, 17622 Wrightwood La., Huntington Beach, Calif. 92649

[21] Appl. No.: 531,217

[22] Filed: Sep. 19, 1995

[51] Int. Cl.⁶ .................................................... B05C 17/04
[52] U.S. Cl. ........................ 101/123; 101/126; 101/407.1; 101/474
[58] Field of Search ..................... 101/115, 114, 101/118, 123, 125, 126, 129, 407.1, 474, 489

[56] References Cited

U.S. PATENT DOCUMENTS

| | | | |
|---|---|---|---|
| Re. 29,160 | 3/1977 | Jaffa | 101/123 |
| Re. 29,206 | 5/1977 | Jaffa | 101/126 |
| 3,977,322 | 8/1976 | Jaffa | 101/126 |
| 4,054,091 | 10/1977 | Bradley | 101/129 |
| 4,063,503 | 12/1977 | Ichinose | 101/123 |
| 4,079,674 | 3/1978 | Ichinose | 101/129 |
| 4,273,042 | 6/1981 | Machida | 101/123 |
| 4,404,903 | 9/1983 | Cronin | 101/123 |
| 4,407,195 | 10/1983 | Jaffe | 101/123 |
| 4,474,109 | 10/1984 | Yara | 101/115 |
| 4,712,474 | 12/1987 | Motev | 101/129 |
| 4,735,139 | 4/1988 | Szarka | 101/126 |
| 4,819,559 | 4/1989 | Szarka | 101/474 |
| 4,920,878 | 5/1990 | Harpold et al. | 101/115 |
| 5,327,827 | 7/1994 | Richardson | 101/126 |
| 5,456,172 | 10/1995 | Hermann | 101/115 |

*Primary Examiner*—Eugene H. Eickholt
*Attorney, Agent, or Firm*—James G. O'Neill

[57] ABSTRACT

An automated printing machine has a plurality of printing pallets having elevated printing surfaces connected to an endless chain drive by an elongated bodies. The printing machine includes a positive indexing system for smoothly indexing items to be printed while supported on the elevated printing surfaces, first through a printing station having at least one printing head movable in a plurality of directions, and then to an integrated dryer station, after the printing station, having at least one pivotable dryer therein for selectively drying the printed items held on the elevated printing surfaces, as they pass through the drying station.

20 Claims, 6 Drawing Sheets

AUTOMATED PRINTING MACHINE AND PROCESS

BACKGROUND OF THE INVENTION

1. Field of the Invention

This invention relates generally to automated printing machines and, more particularly, to an improved automated printing machine and process for printing by silk screening in one or more colors on material carried on elevated pallets secured to an endless belt drive, having a positively indexed drive for moving the elevated pallets into and out of printing and drying stations, without hard stops.

2. Description of Prior Art

As is well known, many types of materials and products may be printed on utilizing what is referred to as stenciling or silk screening. Many printing applications, such as the silk screening of printed circuits, or intricate designs having a multiple of colors, require a high degree of precision. To provide the necessary precision in known printing machines, mechanical indexing mechanisms have been utilized to align a pallet carrying a workpiece to be printed on, with the silk screen printing mechanism. In automated machines having more than one print station, to perform such silk screen printing, pallets carrying workpieces to be printed are normally moved by an endless belt through the printing station. In order, for example, to accurately print in more than one color on the workpieces carried by the pallets, the pallets must be stopped, or somehow fixed in relationship to an indexing drive mechanism, to ensure accurate placement of the workpiece from one print station to the next. This indexing is usually carried out by mechanical means, or electro-mechanical means utilizing rigid mechanical connections.

One such known silk screen printing machine using an endless belt-type drive, is shown in U.S. Pat. No. Re. 29,160 to Jaffa, which discloses an oval track rail with a series of pallets supporting workpieces moved in a horizontal plane radially about a vertical axis. The pallets are mechanically indexed from station to station. A printing head assembly is operatively associated for movement into and out of printing relationship with one or more of the pallets as the pallets are mechanically indexed and maintained in the horizontal plane. This patent also discloses the use of one or more locating bars, which mechanically cooperate with the pallets to ensure proper registration of the pallets when in the printing position, and indexing means associated with the drive means in the form of a ram-stop cooperating with a cam follower, to effect intermittent indexing of the pallets from station to station, during machine operation.

Various other U.S. Pat. Nos. such as 4,054,091 to Bradley, 4,063,503 to Ichinose, 4,079,674 to Ichinose, 4,273,042 to Machida, 4,404,903 to Cronin, 4,474,109 to Yara, 4,712,474 to Motev, 4,735,139 to Szarka, 4,819,559 to Szarka, and 5,327,827 to Richardson disclose other automated or mechanical printing processes, some of which drive and index printing pallets, or mechanical printing apparatus which attempt to solve the precision alignment or known problems, as indicated therein. Some of these patents include heating booths, drying means, washing means, or the like to dry printed items and to wash printing surfaces. None of these patents, however, disclose an automated printing machine which provides multiple printing stations, for printing in one or more colors, integrated drying means, so as to provide complete, accurate, automated printing and drying of larger, more complex pieces with more positive indexing, and which is not subject to mechanical failure because of hard stops.

Therefore, although the known printing processes and machines shown in the prior art solve many of the problems with precision printing of some workpieces, and attempt to solve the problems that occur because of the stretching of endless belts and/or hard stopping required with known mechanical indexing means, none of the available processes or machines solve all the known problems with precision alignment, or enable an automated printing machine to more accurately and efficiently print large size pieces, in one or more colors, at higher Speeds, while being positively indexed in a more desirable manner.

SUMMARY OF THE INVENTION

Accordingly, it is a general object of the present invention to provide an improved automated printing machine. It is a more particular object of the present invention to provide an automated printing machine having an integrated dryer after the printing section. It is a further object of the present invention to provide an automated printing machine having an elongated, endless chain drive with elevated pallets thereon. It is yet a further object of the present invention to provide an improved automated printing machine capable of printing large sized pieces on elevated pallets. It is still a further particular object of the present invention to provide an automated printing process and machine, having more positive indexing, for printing of substantially any size workpiece on elevated pallets secured to an endless chain drive. And it is yet another particular object of the present invention to provide an improved automated printing machine or process having a plurality of elevated pallets traveling at an ergonomic height and which are first indexed to a printing station for the accurate printing by one or more unique printing heads, and which are then indexed to one or more drying stations where the printed materials may be dried or cured, by means of unique drying means.

In accordance with one embodiment of, the present invention there is provided a novel and unique automated printing machine having a plurality of elevated printing pallets secured to an elongated, endless belt drive having at least one alignable printing head provided at a printing station for printing items, and an indexing drive means whereby items to be printed on the elevated pallets may be positively indexed to the printing station and to an integrated drying station having movable dryers, downstream from the printing station.

BRIEF DESCRIPTION OF THE DRAWINGS

The objects and features of the present invention which are believed to be novel, are set forth in particularity in the appended claims. The present invention, both as to its organization and manner of operation, together with further objectives and advantages, may best be understood by reference to the following description, taken in connection with the accompanying drawings, in which:

DESCRIPTION OF THE PREFERRED EMBODIMENTS

The following description is provided to enable any person skilled in the art to make and use the invention and sets forth the best modes contemplated by the inventor of carrying out his invention. Various modifications, however, will remain readily apparent to those skilled in the art, since the generic principles of the present invention have been defined herein specifically to provide for a novel and improved automated printing machine, with improved printing heads and a novel integrated dryer means, as well as having elevated pallets to enable pieces to be more positively printed and dried, through the use of a more positive indexing means, to enable the improved printing heads to more accurately print, as by the use of silk screens, in one or more colors on selected workpieces.

Turning now to FIGS. 1–4 of the drawings, there shown is a novel automated printing machine 10 having a printing station 12, which may include one or more unique printing heads or mechanisms 13, and a drying station 14, after or downstream of the printing station. The drying station 14 includes a rectangular frame with at least partially open top and bottom portions, and one or more pivotable dryers 15, such as hot air dryers, infra-red lamps, or electric dryers, held within the rectangular frame to dry or cure pieces after they have been printed at the printing station 12. Machine 10 also preferably includes an elongated, endless belt drive means 16, preferably a chain drive means, having overlapping covers, plates or tiles 17, which are preferably formed from acetal, or other plastic like material to protect the chain. Depending on the size of the item to be printed on the machine, a number of side-by-side drive means 16 may be used. The drive means carries a plurality of elevated pallets 18, comprised of elevated printing surfaces 19, which may take any shape so as to conform to the profile of the substrate being printed, and which are secured to the belt drive means 16, by elongated bodies 20, of a predetermined height. Also, depending on the shape and size of the printing surfaces 19, a number of side-by-side chain drives 16 may be used.

The elongated bodies 20 may take any desired shape, and are preferably approximately six inches to ten inches high. One end thereof is secured to the endless belt means 16 by a plurality of securing means (not shown), such as screws or the like. It, therefore, can be seen that the plurality of elevated pallets 18 are raised or spaced substantially above the surface of the endless drive means 16, approximately six to ten inches. This distance or space from the drive means allows items to be printed, to be more easily loaded on and off the printing surface 19, and to prevent printing directly on the endless drive means 16, or the plate means 17. In a preferred embodiment of the invention, the printing surface 19 is located at a distance of approximately forty inches from the floor on which the printing machine 10 stands, so as to be at an ergonomic height enabling a worker, or a loading mechanism, to more easily place on or remove items from printing surfaces 19.

Furthermore, with the improved printing process and machine of the present invention, when utilizing a plurality of printing heads 13 at printing station 12, the endless drive means 16 may be provided with a plurality of side-by-side chains, or the like, each of which may be provided with an elongated body identical or similar to 20 so as to support a larger printing surface 19, thereby allowing larger items to be supported, printed and dried on the machine 10.

Figure 1:
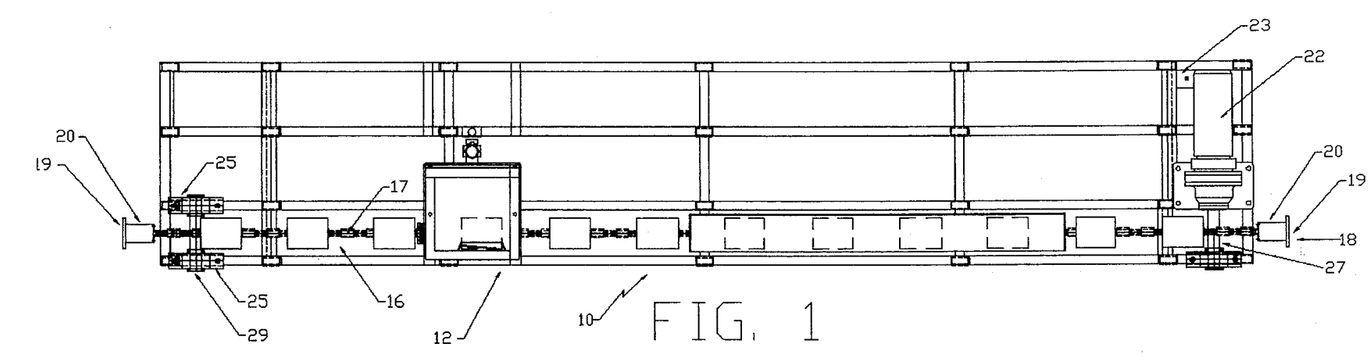
FIG. 1 is top elevational view of one embodiment of an improved automated printing machine of the present invention having unique printing means, a unique integrated dryer means, and elevated printing pallets.
Figure 2:
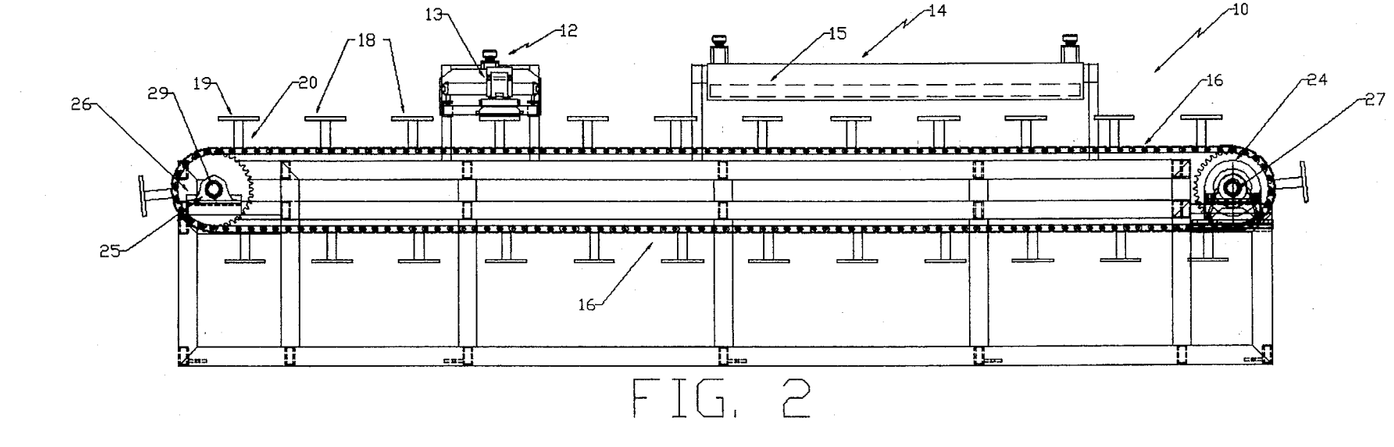
FIG. 2 is a front elevational view of the automated printing machine of FIG. 1.
Figure 8:
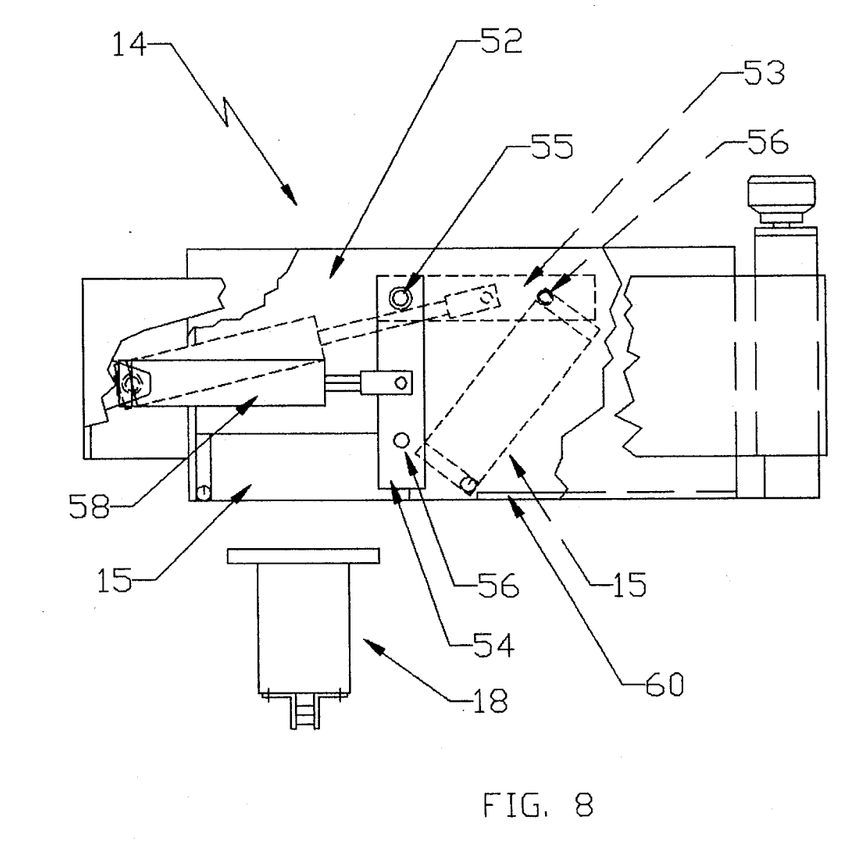
FIG. 8 is an enlarged partial end view of the integrated dryer of the printing machine of the present invention, having a pivotable dryer therein.

The machine 10 first indexes items to be printed by the unique printing heads 13 at the printing station 12, and then indexes the pallets 18 to the drying station 14, where one or more drying means 15 are used to dry the item so printed. As shown in FIGS. 2 and 8, the dryer means 15 may be automatically flipped out of the way with the dryer portion thereof blocked or shielded, when not in use, or when printing items for which it is not desired that the items be cured or dried, as is explained more fully below.

Figure 3:
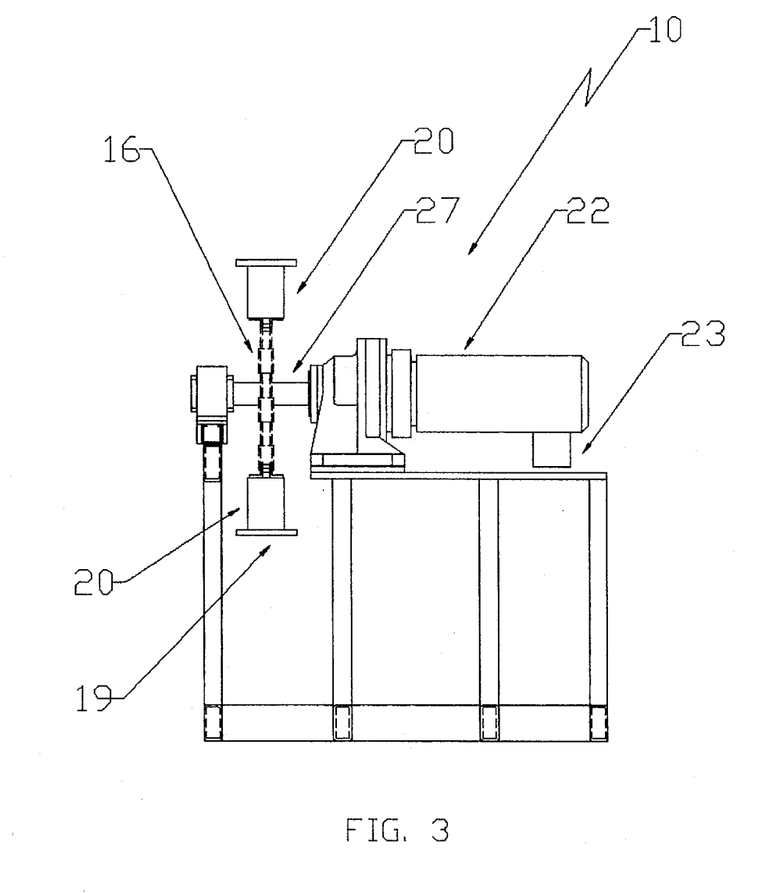
FIG. 3 is an enlarged right hand end view of the automated printing machine of the present invention.
Figure 4:
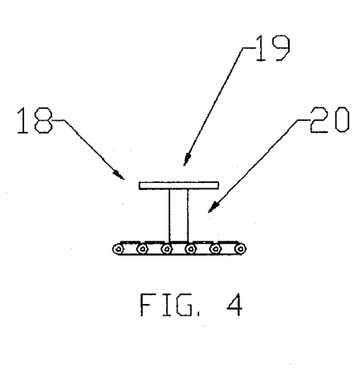
FIG. 4 is a partial side view of an elevated pallet of the present invention.

Referring now to FIG. 3, there shown is a drive means 22, such as a servomotor having a special drive and a drive control means 23 to allow the endless belt drive means 16 to be started and stopped in such a manner that it is positively driven and indexed so as to always have a soft stop, not available with known mechanically actuated hard stop means. The drive control means 23 enables the drive means to intermittently turn a drive sprocket wheel 24 over which the chain 16 is entrained. The other or far end of the endless belt means 16 is entrained over a driven sprocket wheel 26, adjustably held in pillow block means 25. It being understood, of course, that if a plurality of chain drives are used within the machine 10, that a plurality of drive sprocket wheels 24 and a plurality of driven sprocket wheels 26 may be mounted on shaft means, such as 27, 29, which shaft means may be elongated so as to carry such plurality of drive and driven sprockets, in a manner well known to those skilled in the art.

Any type of desired indexing means not shown may be operatively connected with the drive control means 23, such as readable or sensing elements, or other means placed on the chain 16, adjacent the pallets 18. Such elements are normally readable by electronic reading means associated with the drive control means, in a known manner, to accurately stop and start the drive means 22, to accurately position the pallets 18, first at the printing station and then at the drying station. This indexing means permits smooth, intermittent movement or drive of the endless belt means 16 and the elevated pallets 18 to the printing station 12 and the drying station 14, as well as any loading and unloading areas. The drive control means 23 may comprise any known means, such as a gear reduction motor drive, an encoder feedback means, and a programmable logic control means ("PLC"), operatively connected in a known manner between the endless belt means 16 and the motor drive means 22, so as to more positively index and align on or more pallets 18 within the printing station 12 and drying station 14, during operation of the machine. This indexing means provides smooth start-up and stopping which prevents hard stops, such as known abrupt stops, using mechanical means, thus avoiding breakage. Therefore, the drive control means 23 allows the machine of the present invention to accurately print substantially any size workpieces, in a faster, more controlled and reliable manner, on elevated printing surfaces 19 of the pallets 18.

If a number of chains 16 are used, or the chain is of considerable length, known roller or guide means, or other known types of guiding mechanisms may be used in or around the chains to properly guide and/or support the chains along their length. Furthermore, with the adjustable pillow block means 25 holding the driven sprocket wheel 26, the chains may be continuously tightened and/or aligned to ensure proper operation of the machine.

Figure 5:
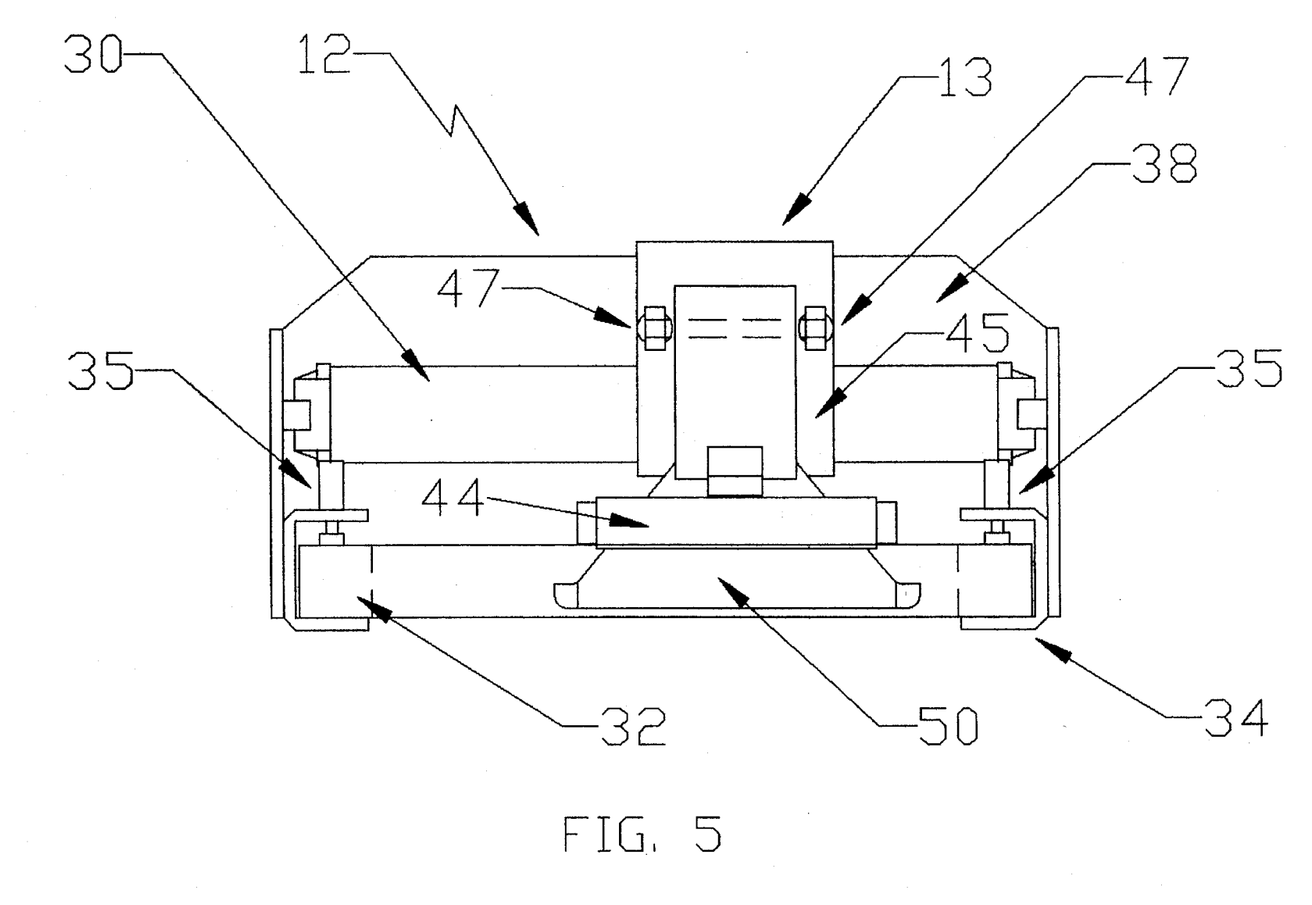
FIG. 5 is a partial enlarged front elevational view of the printing station of the machine showing a preferred embodiment of one of the novel printing heads of the present invention.
Figure 6:
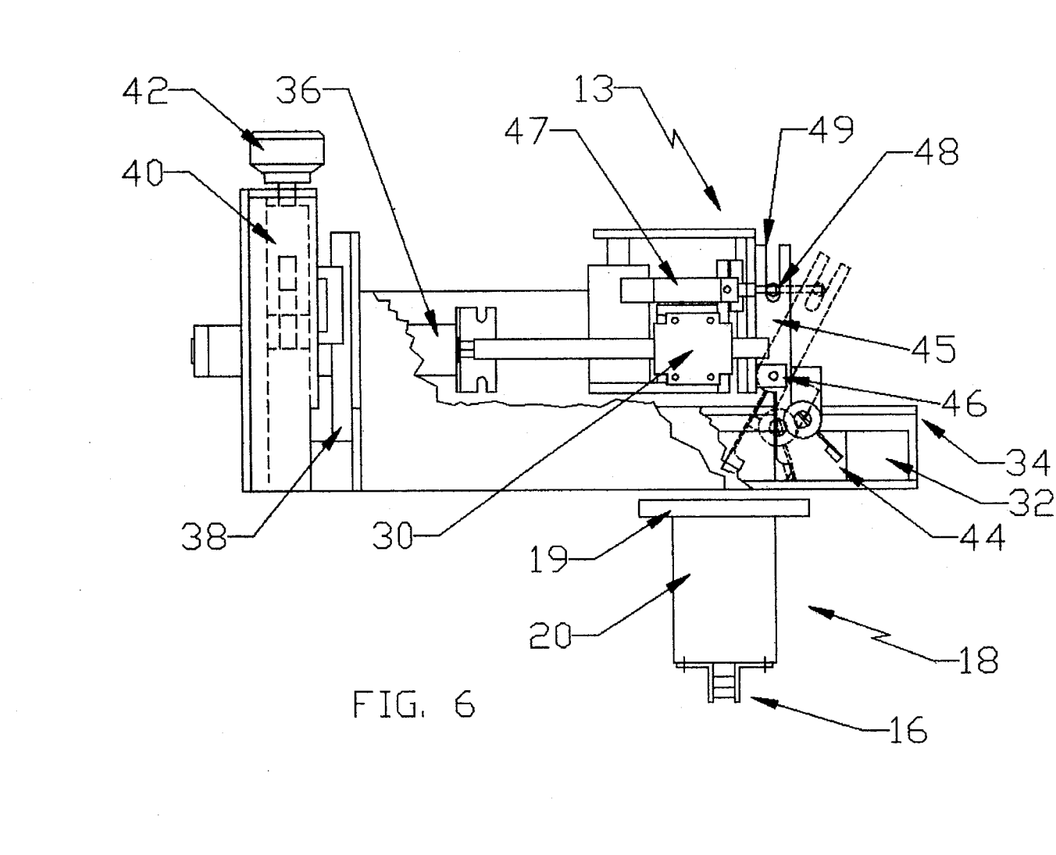
FIG. 6 is a side elevational view of the printing head of FIG. 5 shown over an elevated pallet.
Figure 7:
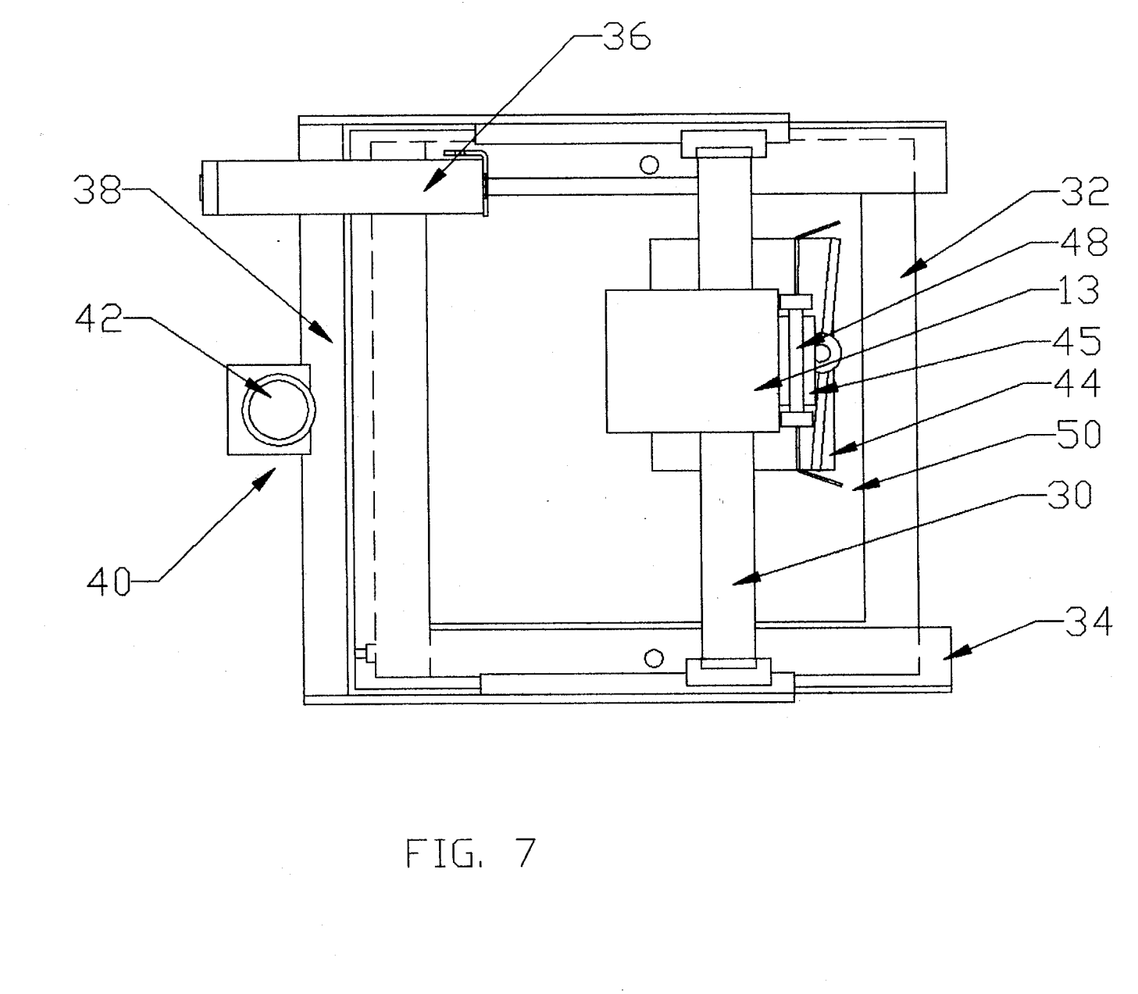
FIG. 7 is a top plan view of the printing head of FIG. 5.

Turning now to FIGS. 5–7, there shown is an improved print head means 13 of the present invention. It is to be understood that a plurality of print head means 13 may be used to print a printed circuit, or to print in a number of colors on workpieces, such as cloth, T-shirts, posters, or other large size items such as wall hangings, etc., in a secure manner, while they are supported on the elevated printing surfaces 19 of pallets 18, thereby allowing large workpieces to be more accurately printed.

The novel print heads 13 of the present invention are held in a position so that they print in a plane which is substantially parallel to the moving endless belt means 16 and the elevated printing surfaces 19. Furthermore, as explained more fully below, the print heads and parts thereof are easily adjustable, so as to be accurately aligned with respect to the printing surfaces 19, to obtain the best possible printing results.

For example, each of the print heads 13 are slidably mounted on means 30, such as a cross bar, so as to be translatable along the cross bar, and then secured thereon, by any known means, in a selected position. A silk screen means 32 is slidably supported in a channel or frame holding means 34 secured below or underneath the printing head 13. After being inserted therein, the screen 32 is clamped within the channel holding means 34, by clamping means 35, particularly during printing.

The cross bar 30 includes means such as a linear bearing, rollers or wheels at its ends, and is mounted so as to be moveable over or along the channel holding means 34 in the direction perpendicular to the cross bar and the movement of the printing head 13 therealong. Movement of the cross bar and print head 13 over the channel holding means 34 is preferably accomplished by actuating means 36, which can take any desired form, such as a pneumatic or hydraulic piston, a motor drive belt system, or other similar means.

The printing head 13, the cross bar 30, frame holder 34 and actuator 36 form an assembly or printing station that is mounted to a substantially vertical rear holding plate 38 by the frame holder 34. This rear holding plate 38 is in turn movably mounted to the frame of the printing machine 10, as by a column 40, and has an adjusting means 42 (see FIGS. 6 and 7), such as a knob, that may be rotated to accurately position the plate 38, and, therefore, the entire assembly or printing station, in the vertical direction, with respect to the pallets attached to the endless belt means 16, printing surfaces 19 and any workpiece contained thereon.

A printing squeegee 44 is removably and rotatably secured to a lower end of a rotatable face plate 45 mounted to the front of the printing head 13, as by means of a quick release removable anchor pin 46. The face plate 45 is rotated with respect to the print head by any desired mechanical means, such as one or more pneumatic or hydraulic pistons 47 secured to a holding pin 48 held in a substantially U-shaped opening 49 formed at the top of the face plate 45. Upon actuation of the pistons 47, the pin 48 will rotate the top of the front face 45 forward around anchor pin 46, thus causing the face plate 45 to rotate the printing squeegee 44. As best shown in broken line in FIG. 6, this rotation of the front plate 45 will rotate or lower the printing squeegee 44 downwardly, toward the screen 32. This downward rotation occurs after a flood cycle, when a flood bar 50 presses ink into the screen 32, in a known manner. During the printing cycle, the downwardly rotated printing squeegee 44 applies the ink to the item being printed, as the squeegee is translated over the ink in the screen by movement of the print head 13. The flood bar or plate 50 is preferably over or along the channel holding means 34 in the direction perpendicular to the cross bar and the movement of the printing head 13 therealong. Movement of the cross bar and print head 13 over the channel holding means 34 is preferably accomplished by actuating means 36, which can take any desired form, such as a pneumatic or hydraulic piston, a motor drive belt system, or other similar means.

The printing head 13, the cross bar 30, frame holder 34 and actuator 36 form an assembly or printing station that is mounted to a substantially vertical rear holding plate 38 by the frame holder 34. This rear holding plate 38 is in turn movably mounted to the frame of the printing machine 10, as by a column 40, and has an adjusting means 42 (see FIGS. 6 and 7), such as a knob, that may be rotated to accurately position the plate 38, and, therefore, the entire assembly or printing station, in the vertical direction, with respect to the attached to the endless belt means 16, printing surfaces 19 and any workpiece contained thereon.

A printing squeegee 44 is removably and rotatably secured to a lower end of a rotatable face plate 45 mounted to the front of the printing head 13, as by means of a quick release removable anchor pin 46. The face plate 45 is rotated with respect to the print head by any desired mechanical means, such as one or more pneumatic or hydraulic pistons 47 secured to a holding pin 48 held in a substantially U-shaped opening 49 formed at the top of the face plate 45. Upon actuation of the pistons 47, the pin 48 will rotate the top of the front face 45 forward around anchor pin 46, thus causing the face plate 45 to rotate the printing squeegee 44. As best shown in broken line in FIG. 6, this rotation of the front plate 45 will rotate or lower the printing squeegee 44 downwardly, toward the screen 32. This downward rotation occurs after a flood cycle, when a flood bar 50 presses ink into the screen 32, in a known manner. During the printing cycle, the downwardly rotated printing squeegee 44 applies the ink to the item being printed, as the squeegee is translated over the ink in the screen by movement formed so as to have angled side portions to sweep all ink into the same when moved across the screen during the flood cycle, before printing by the printing squeegee. This flood bar is preferably mounted to the printing head 13 in a position, such as the front thereof, so as to produce the best operating results during the flood cycle or stroke.

As shown most clearly in FIG. 7, the printing squeegee 44 is also adjustably mounted to the lower portion of the front plate 45, to enable the printing squeegee to be set at any desired angle to allow the printing squeegee to apply or force the ink to a workpiece, through the screen 32, in the most advantageous manner.

It is to be understood that when printing a batch or series of workpieces, the rear holding plate 38, cross arm 30, printing head 13 and printing squeegee 44 will first be adjusted to the desired settings to produce the best results, and then, after ensuring the quality of printing achieved thereby, locked or secured in these positions for printing of such entire batch or series. These elements will only be reset, if they somehow become out of register, or if a new series of workpieces is to be printed utilizing the same or a new screen.

As shown in FIG. 8, the one or more drying means 15 in drying station 14 are capable of being flipped up, or rotated out of the drying position during set-up of the machine, or if no drying of a workpiece is to occur. This rotation of the dryers 15 is automatically accomplished by means of an operating means, such as a mechanical mechanism 52. The operating means 52 includes a cam means 54, such as a pivot arm pivotable about a pivot point 55, which coacts with a toggle link means 56 to raise and lower the dryer 15, upon actuation of a selected drive means, such as an air cylinder 58. As is best shown in broken line in FIG. 8, when the dryers 15 are raised, they are pivoted into a heat shielded area, behind a heat shield 60 formed in a lower portion of the rectangular frame of dryer station 14. With the dryers 15 in this raised position, even if they are turned on, the heat shield 60 will prevent any heat from reaching a workpiece on the pallet 18 passing underneath.

As is known to those skilled in the art, the printing machine of the present invention may be used to either print any desired items held on the elevated pallets 18 and then dry or cure them, or merely print the items and allow them to air dry when passing along the endless belt means 16, until unloaded from the machine. Since the printing surfaces 19 of the pallets 18 are positively elevated or supported, well above the surface of the endless belt means, substantially no printing materials, or other debris, will strike or be applied to the endless belt means, thereby eliminating much of the present need to clean, scrape or wash the endless belt means, as in known machines.

It, therefore, can be seen that an entire printing machine having an integrated printing station, elevated pallets and a drying station, provides a system which may easily and quickly print items of any desired size, and in which a plurality of chain means may be used so as to properly support and drive substantially any size elevated pallets. Indexing means allowing soft stops and more positive indexing is provided within the printing system to allow smoother and faster, more controlled stopping and starting thereof.

Thus, there has been described an improved and simplified printing machine having integrated printing and drying means using elevated pallets that will produce larger and more exactly printed items in a faster, more economical manner to meet today's market with its requirements of more accuracy and speed, while avoiding the wasting of inks, pastels, and the like, now printed on pallets or the endless belts carrying known pallet means.

Those skilled in the art will appreciate that various adaptations and modifications of the just described preferred embodiment can be configured without departing from the scope and spirit of the invention. Therefore, it is to be understood that, within the scope of the appended claims, the invention may be practiced other than is specifically described herein.

What I claim is:

1. An automated printing machine, having an endless belt drive carrying workpieces through a printing station and a drying station, comprising, in combination:

said endless belt drive being a chain drive means having a plurality of interlocking plates thereon;

a plurality of pallets comprising an elevated printing surface secured to said chain drive means by an elongated body, each of the elongated bodies having first and second ends, with the first end secured to said chain drive means and the second end secured to said elevated printing surface, spaced from said chain drive means; and a drive means, connected to a drive wheel sprocket for intermittently driving said chain drive means; said drive means including drive control means for positively indexing said drive control sprocket to accomplish the intermittent driving of said chain drive means without causing any hard stops.

2. The automated printing machine of claim 1 wherein each of said elongated bodies is secured to said chain drive means at the first end by a plurality of securing means, and said elevated printing surface is rigidly secured to the second end thereof.

3. The automated printing machine of claim 1, wherein said drying station includes at least one pivotable dryer.

4. The automated printing machine of claim 3 wherein said at least one pivotable dryer is held within a rectangular frame, and includes actuating means, cooperating with said drive control means for selectively pivoting said dryer away from said chain drive means.

5. The automated printing machine of claim 4 wherein said actuating means includes a mechanical linkage means coupled to a cam means for selectively pivoting said at least one pivotable dryer by movement of said cam means.

6. The automated printing machine of claim 5 wherein there are a plurality of pivotable dryers, each of said plurality of pivotable dryers having mechanical linkage means cooperating with said drive control means and coupled to cam means for selectively pivoting the same.

7. The automated printing machine of claim 6 wherein said chain drive means includes a plurality of side-by-side chains for supporting and moving a plurality of enlarged elevated printing surfaces, extending over said plurality of side-by-side chains.

8. The automated printing machine of claim 1 wherein said printing station includes at least one print head, and said at least one print head is movable in a plurality of directions.

9. The automated printing machine of claim 8 wherein said at least one print head is slidably mounted on a cross bar, and said cross bar is movably mounted on a frame holding means held to a rear holding plate; said rear holding plate being adjustably mounted to a frame.

10. The automated printing machine of claim 9, further including a print squeegee rotatably mounted on a front portion of said at least one print head, and actuating means for pivoting said front portion and said print squeegee relative to said at least one print head; and a further actuating means for translating said cross bar and said at least one print head along said frame holding means.

11. The automated printing machine of claim 10, wherein said front portion of said at least one print head carries said print squeegee and said print squeegee is adjustably secured to said at least one print head.

12. The automated printing machine of claim 11, further including a flood plate having a plurality of angled surfaces secured to a rear portion of said at least one print head.

13. The automated printing machine of claim 12 wherein there are a plurality of print heads at said printing station, and each of the print heads includes frame holding means associated therewith for removably holding a screen therein, between the print head and the elevated printing surfaces of said pallets.

14. The automated printing machine of claim 13, wherein said drying station includes at least one pivotable dryer.

15. The automated printing machine of claim 14 wherein said chain drive means includes a plurality of chains, and said elevated pallets are secured to said plurality of chains by a plurality of securing means.

16. An automated printing machine having an endless belt drive intermittently driving a plurality of pallets through a printing station and then through a drying station, comprising, in combination:

said endless belt drive including a chain drive means;

each of said plurality of pallets having an elevated printing surface and an elongated body, secured to said chain drive means;

at least one movable print head mounted in said printing station;

a drive means, including a drive control means, connected to a drive wheel sprocket for intermittently driving said chain drive means;

at least one pivotable dryer mounted in said drying station; and indexing means connected to said drive control means, for intermittently actuating said drive control sprocket in a smooth controlled manner to thereby intermittently drive each of said elevated printing surfaces, first into said printing station, and then into said drying station, without causing any hard stops.

17. The automated printing machine of claim 16 wherein said chain drive means includes a plurality of side-by-side separate chains; each of said elongated bodies includes a first end and a second end with said first end of each of said elongated bodies being secured to one of said plurality of separate chains by a plurality of securing means and said second end of each of said elongated bodies is secured to said elevated printing surface, substantially removed from a top surface of each of the separate chains.

18. An automated printing machine having an endless chain drive means carrying and supporting a plurality of pallets through a printing station, comprising, in combination:

each of said plurality of pallets including a printing surface attached to an elongated body secured to said chain drive means so as to elevate said printing surfaces a predetermined distance from a top surface of said chain drive means to which said elongated body is secured;

drive means connected to a drive sprocket wheel about which said chain drive means is entrained;

a plurality of movable print heads mounted in said printing station;

at least one pivotable dryer mounted in said drying station; and drive control means including indexing means, for intermittently operating said drive means so as to smoothly control intermittent turning of said drive sprocket wheel, and thereby smoothly controlling the intermittent movement of said chain drive means and said plurality of elevated printing surfaces through said printing station, without causing any hard stops, and so as to accurately align said elevated printing surfaces with said plurality of movable print heads mounted in said printing station.

19. The automated printing machine of claim 18 wherein said at least one pivotable dryer is held within a rectangular frame, and includes actuating means, cooperating with said drive control means for selectively pivoting said dryer away from said chain drive means.

20. The automated printing machine of claim 19 wherein each of said plurality of print heads is slidably mounted on a cross bar, and each of said cross bars is movably mounted on a screen holding means secured to a rear holding plate; with said rear holding plate being adjustably mounted to a frame, so as to move each of said plurality of print heads in relation to screen printing means supported below each of said plurality of print heads, toward said elevated printing surfaces, in said screen holding means.

* * * * *